(12) United States Patent
Rogy et al.

(10) Patent No.: US 8,844,826 B2
(45) Date of Patent: Sep. 30, 2014

(54) INTEGRATED CIRCUIT TRANSPONDER, METHOD OF PRODUCING AN INTEGRATED CIRCUIT AND METHOD OF PRODUCING A TRANSPONDER

(75) Inventors: Reinard Rogy, Graz (AT); Christian Zenz, Graz (AT)

(73) Assignee: NXP B.V., Eindhoven (NL)

( * ) Notice: Subject to any disclaimer, the term of this patent is extended or adjusted under 35 U.S.C. 154(b) by 914 days.

(21) Appl. No.: 12/307,779

(22) PCT Filed: Jul. 9, 2007

(86) PCT No.: PCT/IB2007/052692
§ 371 (c)(1),
(2), (4) Date: Jan. 23, 2009

(87) PCT Pub. No.: WO2008/007327
PCT Pub. Date: Jan. 17, 2008

(65) Prior Publication Data
US 2009/0283602 A1 Nov. 19, 2009

(30) Foreign Application Priority Data
Jul. 10, 2006 (EP) .................................... 06116899

(51) Int. Cl.
*G06K 19/06* (2006.01)
*G06K 19/077* (2006.01)
*H01L 23/00* (2006.01)

(52) U.S. Cl.
CPC .... *G06K 19/07749* (2013.01); *G06K 19/07775* (2013.01); *H01L 24/80* (2013.01); *G06K 19/07779* (2013.01); *H01L 24/82* (2013.01); *H01L 2924/01079* (2013.01); *H01L 2924/01082* (2013.01); *H01L 2924/30105* (2013.01); *H01L 2224/0231* (2013.01); *H01L 2924/19041* (2013.01); *H01L 24/11* (2013.01); *H01L 2924/014* (2013.01); *H01L 2224/92144* (2013.01); *H01L 2224/81205* (2013.01); *H01L 2224/02333* (2013.01); *H01L 2924/01013* (2013.01); *H01L 24/81* (2013.01); *G06K 19/0775* (2013.01); *H01L 2224/83801* (2013.01); *H01L 2224/81801* (2013.01); *H01L 2924/14* (2013.01); *H01L 2224/13099* (2013.01); *H01L 2924/01033* (2013.01); *H01L 24/83* (2013.01); *H01L 2224/13144* (2013.01)
USPC .......................................... 235/492; 235/487

(58) Field of Classification Search
USPC ................................................ 235/487, 492
See application file for complete search history.

(56) References Cited

U.S. PATENT DOCUMENTS 3,503,124 A * 3/1970 Mecchi et al. ................ 438/586
5,130,275 A * 7/1992 Dion ............................. 438/614

(Continued)

FOREIGN PATENT DOCUMENTS

EP   0793146 A   9/1997
EP   0810659 A   12/1997

(Continued)

*Primary Examiner* — Paultep Savusdiphol

(57) ABSTRACT

In a method of producing an integrated circuit (1, 91, 131) for a transponder (2, 112) a photoresist layer (11) is applied on a first surface (8) of a semiconductor device (3). A patterned mask (14, 94) is generated by lithographically patterning the photoresist layer (11), so that the photoresist layer (11) comprises at least one first via (12, 13). The patterned mask (14, 94) comprises a second surface (17) facing away from the first surface (8). The first via (12, 13) is filled with a first bump (15, 16) by depositing the first bump (12, 13) on the first surface (8). A conductive structure (18, 19, 98, 99, 132) is formed on the second surface (17) of the patterned mask (14, 94). The conductive structure (18, 19, 98, 99, 132) is electrically connected to the first bump (15, 16).

18 Claims, 6 Drawing Sheets

(56) References Cited

U.S. PATENT DOCUMENTS

| | | | |
|---|---|---|---|
| 5,139,880 A | 8/1992 | Zupancic et al. | |
| 5,277,756 A * | 1/1994 | Dion | 438/754 |
| 5,502,335 A * | 3/1996 | Oda | 257/751 |
| 6,200,849 B1 * | 3/2001 | Kim | 438/241 |
| 6,281,106 B1 * | 8/2001 | Higdon et al. | 438/613 |
| 6,388,202 B1 * | 5/2002 | Swirbel et al. | 174/261 |
| 6,424,315 B1 * | 7/2002 | Glenn et al. | 343/895 |
| 6,440,773 B1 * | 8/2002 | Usami | 438/107 |
| 6,586,322 B1 * | 7/2003 | Chiu et al. | 438/612 |
| 6,696,356 B2 * | 2/2004 | Tseng et al. | 438/612 |
| 6,734,568 B2 * | 5/2004 | Matsuo et al. | 257/781 |
| 6,812,040 B2 * | 11/2004 | Kyler et al. | 438/3 |
| 6,838,368 B1 | 1/2005 | Ohsawa et al. | |
| 6,841,862 B2 | 1/2005 | Kikuchi et al. | |
| 7,199,036 B2 * | 4/2007 | Chan et al. | 438/613 |
| 7,410,884 B2 * | 8/2008 | Ramanathan et al. | 438/455 |
| 2002/0064930 A1 * | 5/2002 | Ishikawa | 438/612 |
| 2002/0173073 A1 * | 11/2002 | Liang et al. | 438/107 |
| 2003/0119300 A1 * | 6/2003 | Chiu et al. | 438/615 |
| 2005/0093090 A1 * | 5/2005 | Shindo | 257/528 |
| 2006/0081982 A1 * | 4/2006 | Huang et al. | 257/737 |
| 2006/0118952 A1 * | 6/2006 | Suzuki et al. | 257/737 |
| 2007/0117348 A1 * | 5/2007 | Ramanathan et al. | 438/455 |
| 2007/0158804 A1 | 7/2007 | Hosoya et al. | |
| 2007/0257347 A1 * | 11/2007 | Chang | 257/682 |
| 2008/0220597 A1 * | 9/2008 | Cameron et al. | 438/530 |

FOREIGN PATENT DOCUMENTS

| | | |
|---|---|---|
| EP | 1154471 A1 | 11/2001 |
| EP | 1369919 A1 | 12/2003 |
| GB | 2366078 A | 2/2002 |
| WO | 9208209 A | 5/1992 |
| WO | 03038745 A | 5/2003 |
| WO | 2007086809 A | 8/2007 |

* cited by examiner

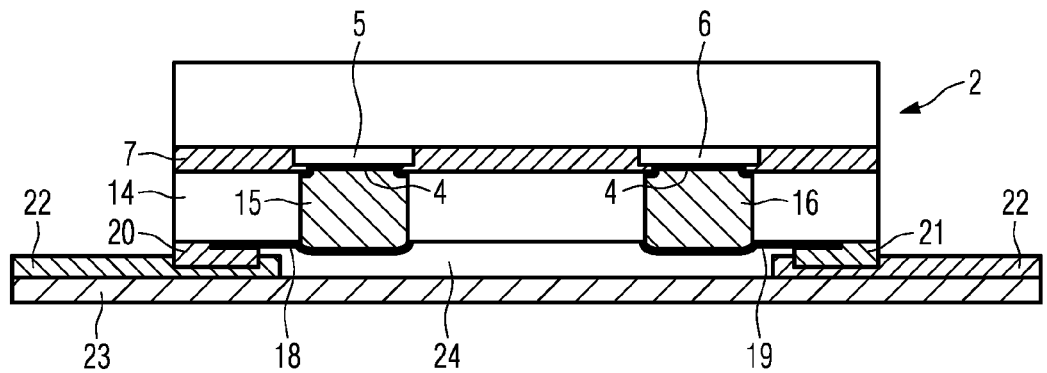

FIG. 7

Applying a photoresist layer (11) on a surface (8) of a semiconductor device (3), wherein the surface (8) comprises connection pads (5, 6)

Generating a patterned mask (14) by lithographically patterning the photoresist layer (11) to comprise vias (12, 13) each matching a respective connection pad (5, 6)

Filling the vias (12, 13) with bumps (15, 16)

Depositing, on the patterned mask (14), flashes (18, 19) which are connected electrically to the bumps (15, 16)

Depositing, on the patterned mask (14), bumps (20, 21) which are offset with respect to the vias (12, 13) and are touching the flashes (18, 19)

Generating a transponder (2) by attaching the integrated circuit (1) to a substrate (23) which comprises an antenna (22) so that the antenna (22) is electrically connected to the bumps (20, 21)

FIG. 8

INTEGRATED CIRCUIT TRANSPONDER, METHOD OF PRODUCING AN INTEGRATED CIRCUIT AND METHOD OF PRODUCING A TRANSPONDER

FIELD OF THE INVENTION

The invention relates to an integrated circuit, a transponder, a method of producing an integrated circuit, and a method of producing a transponder.

BACKGROUND OF THE INVENTION

A transponder or tag comprises an integrated circuit and an antenna. The integrated circuit is designed to process a signal captured by the antenna and, in response to the captured signal, to generate a response signal to be transmitted by the antenna. The antenna is normally supported by a substrate and the integrated circuit is attached to the substrate by the so-called flip-chip mounting process.

A known integrated circuit comprises contacts at the surface facing the substrate. The contacts are comprised of connection pads connected to bumps, which bumps are electrically connected to the antenna. When producing the transponder, the integrated circuit is attached to the substrate, e.g. by means of a glue layer spread over the substrate. The integrated circuit is then pressed on the substrate with the glue layer, wherein the surface of the circuit comprising the bumps faces the substrate. Due to the pressure, the integrated circuit, and particularly the connection pads as well as the areas around the connection pads within the integrated circuit may be subjected to severe stress which leads to possible deformation of the bumps and/or the antenna around the bumps. As a result, the connection pads should have a relatively large surface and the integrated circuit should only have structures around the connection pads, withstanding the pressure during bonding.

Published U.S. application for patent 2002/0001937 A1 discloses a semiconductor package board for mounting thereon a semiconductor chip. The semiconductor board includes a metal base having an opening for receiving therein the semiconductor chip and a multilayer wiring film layered on the metal base. The semiconductor chip is flip-chip bonded on the metal pads disposed on the multilayer wiring film within the opening. The semiconductor package board is manufactured by forming resist plates on the surface of a metal base. The resist plates have openings to be filled with metal pads and a metallic film. Then, the resist plates are removed. Next, a patterned insulating layer made of an insulating resin and comprising vias is formed on the metal base. A wiring layer is then formed on the insulating layer. The wiring layer is electrically connected to a conductive material, which fills the vias in the insulating layer. Then, the steps for forming the insulating layer and the wiring layer are repeated for forming the multilayer wiring film. Next, an etching resist is formed on the rear surface of the multilayer wiring film and on the front surface of the metal base. The metal base is etched, using the etching resist as a mask, until the multilayer wiring film is exposed so as to form a recess. The etching resist is then removed.

Published U.S.-application for patent 2003/0017414 A1 discloses a method of producing a flip chip having solder bumps, an integrated underfill, and a separate flux coating. Initially, a semiconductor device having connection pads on a surface thereof and an underfill material applied to the surface is processed so that the underfill material forms apertures positioned precisely at the connection pads. The main component of the underfill material is a thermoplastic resin. The apertures are made utilizing a photoablation process, because a photoablation process needs only a minimum amount of heating. Then, the apertures are filled with a solder material to form solder bumps electrically connected to the pads. The solder bumps extend slightly above the underfill material.

When mounting this flip chip on a substrate by pressing the flip chip against the substrate and heating up the solder bumps, then the thermoplastic resin of the underfill softens or even melts and hence is likely deformed, so that the connection pads and the areas around the connection pads are still be exposed to a relatively high pressure, which may lead to malfunctioning of the transponder.

OBJECT AND SUMMARY OF THE INVENTION

It is an object of the present invention to provide a method of producing an integrated circuit for a transponder comprised of the integrated circuit attached to a substrate with an antenna structure and a method of producing such a transponder, which methods allow producing an integrated circuit, wherein during the assembling step less stress occurs for the connection pads and for areas of the integrated circuit located close to the connection pads to the substrate.

Other objects of the present invention are to provide a corresponding integrated circuit and corresponding transponders.

The object is achieved in accordance with the invention by means of a method of producing an integrated circuit for a transponder, the method comprising the steps of:

applying a photoresist layer on a first surface of a semiconductor device, generating a patterned mask by lithographically patterning the photoresist layer, so that the photoresist layer comprises at least one first via; the patterned mask comprising a second surface facing away from the first surface;

filling the first via with a first bump by depositing the first bump on the first surface, and forming, on the second surface of the patterned mask, a conductive structure electrically connected to the first bump.

The inventive integrated circuit is manufactured by first applying the photoresist layer on the surface of the semiconductor device. The semiconductor device is particularly a die. Thus, a plurality of integrated circuits can be manufactured utilizing a wafer and, after depositing the conductive structure, separating the individual integrated circuits, each comprising a die, from the wafer.

The photoresist layer is utilized as the patterned mask for the at least one first bump, which is deposited on the first surface of the semiconductor device. Contrary to solder bumps, bumps made by the deposition process are relatively easy to manufacture. Additionally, deposited bumps have a relatively high conductivity, particularly when the deposited bumps are gold bumps, as is the case according to an embodiment of the inventive method. The first surface may comprise at least one connection pad. The first via may be generated in such a way that it matches the connection pad. In this case, the first bump may be deposited directly on the connection pad. The connection pad may also be covered with a flash, particularly a gold flash, for an improved depositing of the first bump. The via may also be offset with respect to the connection pad. Then, a conductive structure, such as the flash may extend over the first surface of the semiconductor device, so that it is beneath the first via. Thus the first bump is deposited on the flash and therefore is connected, via the flash, to the connection pad.

The conductive structure is then formed directly on the patterned mask made of the photoresist. As a result, since the patterned mask is not removed, but is used as a redistribution layer for the conductive structure, producing the inventive integrated circuit is relatively simple, resulting in savings of production cost.

A further advantage of the photoresist layer is that is relatively hard and less subject to deformation during attaching the inventive integrated circuit, contrary to a thermoplastic layer made of cross-linking resin. This is of particular advantage when utilizing compression bonding on a substrate including an antenna structure for obtaining a transponder.

Consequently, the patterned mask will absorb a relatively large amount of stress during such a bonding step, alleviating the connection pad and the area, within the integrated circuit, around the connection pad. This allows to reduce the size of the connection pad and alleviates restrictions regarding the area around the connection pad within the semiconductor device.

The antenna structure and conductive layers within the semiconductor device form stray capacitors, which may affect the performance of the transponder, particularly when used as an RFID (radio frequency identification) or a UHF (ultra high frequency) label. The stray capacitors depend on the distance between the antenna structure and the integrated circuit. Since the patterned mask made of the photoresist material can be manufactured having a predefined layer thickness, which—if at all—only hardly changes during the step of attaching the integrated circuit to the substrate, the resulting transponder has predetermined stray capacitors making the tuning of the transponder easier.

Additionally, the patterned mask may function at least partly as an underfill between the substrate and the integrated circuit, absorbing at least partly thermo-mechanical stress, which especially a plastic substrate may be exposed to. Furthermore, during the compression bonding, not just the first bump is subjected to the resulting pressure, but the pressure is rather distributed to the patterned mask. This results in less stress to the antenna structure.

The connection structure may be used to be connected to a second bump. According to one embodiment of the inventive method, the second bump is deposited on the second surface of the patterned mask, is offset with respect to the first via, and touches the conductive structure. The second bump, which may be a gold bump, is particularly used to be electrically connected to the antenna structure of the substrate, when used to produce the transponder. Since the second bump is offset with respect to the via, the second bump is also offset with respect to the first bump and thus is not in direct contact with the semiconductor device of the integrated circuit. Therefore, when the integrated circuit is pressed against the substrate to produce the transponder, the second bump does not press directly against the semiconductor device. Since the patterned mask also at least partly absorbs the pressure, the connection pad and the semiconductor device is exposed to less stress, allowing smaller connection pads for the integrated circuit and allowing a less stringent design of the semiconductor device.

According to an alternative embodiment of the inventive method, at least one second via is formed in the photoresist layer, the second via is filled with a second bump, and the conductive structure is formed on the second surface of the patterned mask to electrically connect the first bump to the second bump, which may be gold bumps. Particularly, if the second via is formed at an edge of the integrated circuit, then the antenna structure of the transponder may be connected to the integrated circuit at its side walls. In this case, the integrated circuit can also be mounted on the substrate up-side up.

As already mentioned, the integrated circuit is meant to be used for a transponder, which comprises, in addition to the integrated circuit, the substrate with the antenna structure, which antenna structure may be connected to the second bump.

According to one embodiment of the inventive method, the conductive structure on the patterned mask is an antenna. Then, the integrated circuit may form an entire transponder, if this antenna is its main antenna. Alternatively, this antenna may an antenna meant to be coupled to a further antenna of the transponder.

The object is also achieved in accordance with the invention by means of an integrated circuit comprising: a semiconductor device, which comprises a first surface, a patterned mask made of a photoresist layer applied on the first surface, wherein the photoresist layer has at least one via filled with a first bump deposited on the first surface, wherein the patterned mask comprises a second surface facing away from the first surface; and a conductive structure deposited on the second surface and electrically connected to the first bump.

The conductive structure may be an antenna so that the inventive integrated circuit forms a transponder and the first bump may be a gold bump.

The inventive integrated circuit may also be used, in combination with the substrate including an antenna structure, to form a transponder.

An embodiment of the inventive integrated circuit may comprise at least one second bump deposited on the second surface of the patterned mask, wherein the second bump is offset with respect to the first via and touches the conductive structure. An inventive transponder including such a version of an inventive integrated circuit may comprise the substrate with the antenna structure, wherein the substrate is attached to the second surface of the inventive integrated circuit, so that the antenna structure is electrically connected to the second bump.

In another embodiment of an inventive integrated circuit, the patterned mask has at least one second via filled with a second bump which is electrically connected to the first bump via the conductive structure. An inventive transponder including such a version of the inventive integrated circuit may comprise the substrate comprising the antenna structure, wherein the substrate is attached to the inventive integrated circuit, so that the second surface faces away from the substrate, and wherein a connection electrically connects the antenna structure to the second bump.

BRIEF DESCRIPTION OF THE DRAWINGS

The invention will be described in greater detail hereinafter, by way of non-limiting examples, with reference to the embodiments shown in the drawings.

FIG. 7 is a transponder comprising the integrated circuit of FIGS. 1 to 6;

FIG. 8 is a flow chart illustrating the production of the integrated circuit of FIGS. 1 to 6 and the transponder of FIG. 7;

DESCRIPTION OF EMBODIMENTS

FIGS. 1 to 6 are steps illustrating the production of an exemplary embodiment of an inventive integrated circuit 1 for a transponder 2 shown in FIG. 7. FIG. 8 is an associated flow chart illustrating the production of the integrated circuit 1 and the transponder 2.

Figure 1:
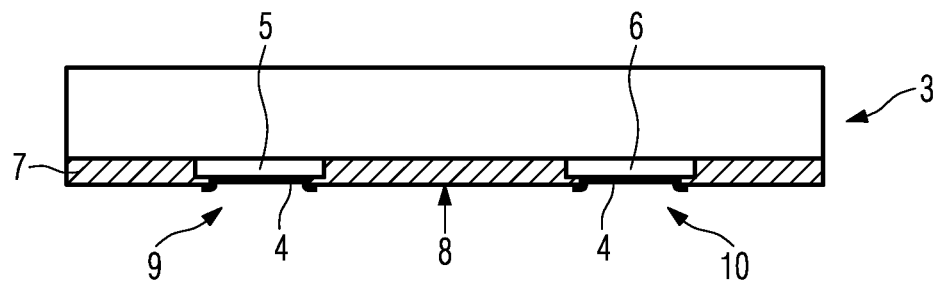
FIGS. 1 to 6 are steps illustrating the production of an exemplary embodiment of an inventive integrated circuit.

In order to produce the integrated circuit 1, a semiconductor device 3, as depicted in FIG. 1, is produced, for instance, on a wafer using commonly known techniques. For the exemplary embodiment, the semiconductor device 3 comprises the circuitry for processing signals received by the transponder 2 and for responding to the received signals, connection pads 5, 6 and a passivation layer 7. The connection pads 5, 6 are provided to be connected to an antenna of the transponder 1. The passivation layer 7 is a sealing layer to prevent deterioration of the electric properties of the circuitry through chemical reaction, corrosion, or handling during a packaging process. The material of the passivation layer 7 is silicon nitride for the exemplary embodiment and forms a surface 8 of the semiconductor device 3. The connection pads 5, 6 are accessible through apertures 9, 10 of the passivation layer 7.

For the exemplary embodiment, the semiconductor device 3 furthermore comprises flashes 4 which are applied on the connection pads 5, 6 as seed layers for a bump process described below. For the exemplary embodiment, the flashes 4 are made of gold, cover the side walls of the apertures 9, 10 and slightly overlap the passivation layer 7. The flashes 4 can be structured via a standard lithographic process or also with an ablation process. In case of not using an electroless bumping process, the flashes 4 may be connected by conductive lines which are then separated during the singulation process of the wafer into dice by sawing, etching or another suitable process.

Figure 2:
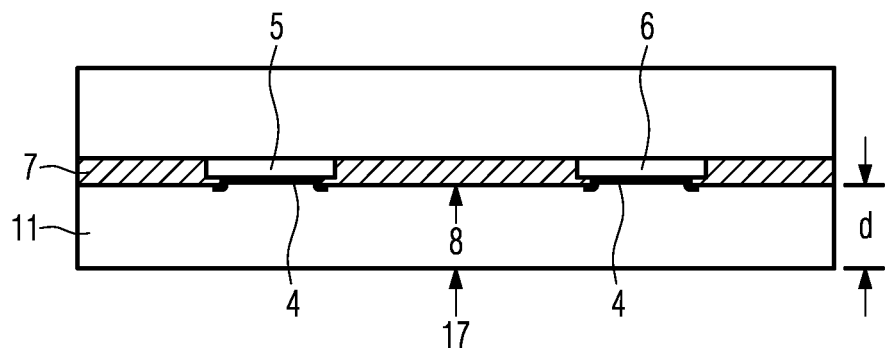

After that, a photoresist layer 11 is deposited on the surface 8 of the passivation layer 7, as it is shown in FIG. 2. For the exemplary embodiment, the photoresist layer 11 is deposited on the surface 8 utilizing a spinning process and has a thickness d of 18 µm. Spinning is a technique in which the photoresist is spun onto the wafer, particularly on the surface 8, resulting in the photoresist layer 11. The photoresist layer 11 has a surface 17 facing away from the semiconductor device 3.

After drying of the photoresist layer 11, the photoresist layer 11 is patterned using lithography. Lithography is a process of pattern transfer. When light is utilized, then this process is termed "photolithography". When the patterns are small enough to be measured in microns, then this process is referred to as micro "lithography".

Figure 3:
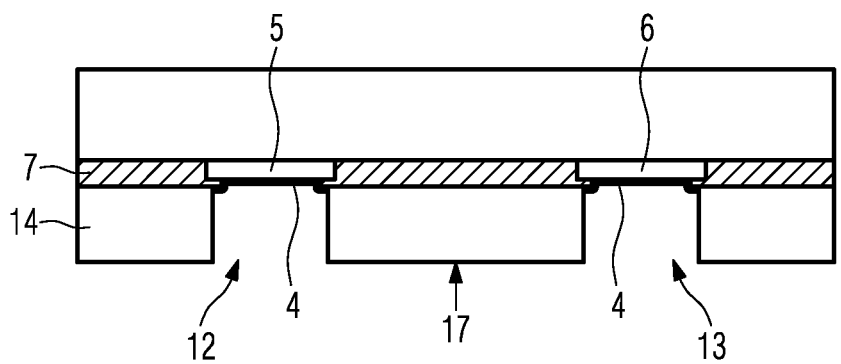

Due to the patterning process, vias 12, 13, as shown in FIG. 3, are formed in the photoresist layer 11 matching and exposing the connection pads 5, 6 including the flashes 4 applied on the connection pads 5, 6. The photoresist layer 11 including the vias 12, 13 forms a patterned mask 14, also having the surface 17 facing away from the semiconductor device 3 and used for the next production step.

Figure 4:
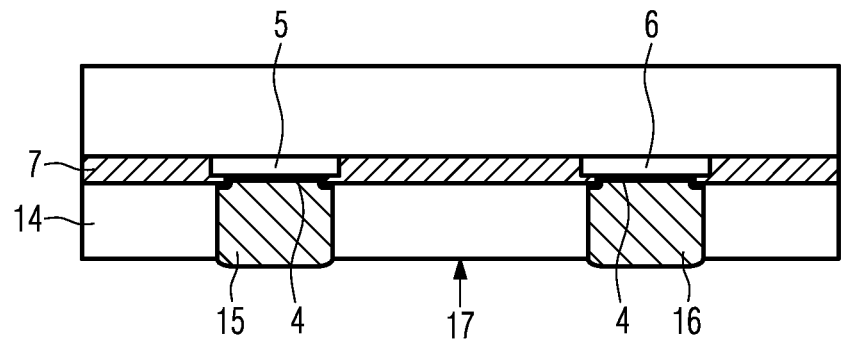

The next production step is depositing bumps 15, 16 in the vias 12, 13, as shown in FIG. 4. For the exemplary embodiment, the bumps 15, 16 are gold bumps and are deposited on the flashes 4 by means of an electroless deposition process.

Figure 5:
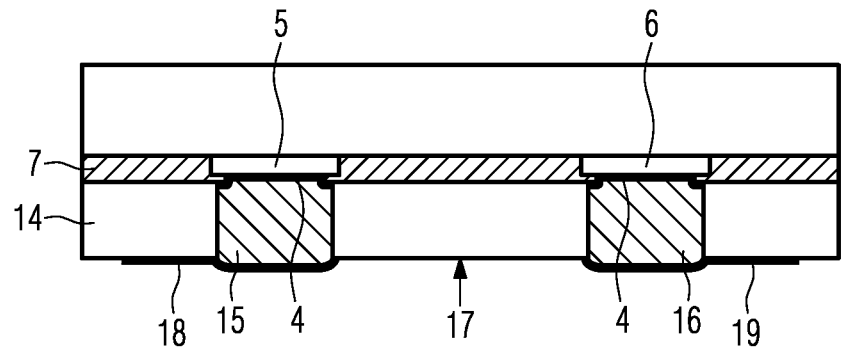
Figure 6:
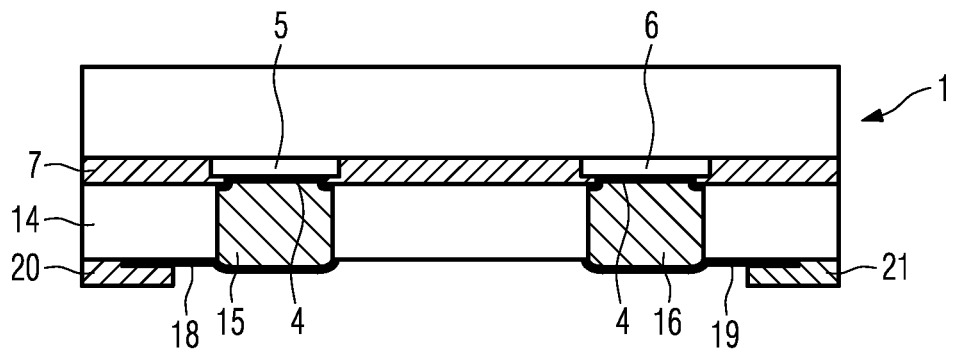

After that, further flashes 18, 19 are deposited on the surface 17 of the patterned mask 14 and on the bumps 15, 16, as shown in FIG. 5. The flashes 18, 19 are made of gold and are deposited by means of an evaporation or sputtering process and are patterned by an ablation process for the exemplary embodiment. The flashes 18, 19 are a conductive structure electrically connected to the bumps 15, 16.

For the exemplary embodiment, then, two further bumps 20, 21 are deposited on the flashes 18, 19 and on the surface 17 of the patterned mask 14 in order to obtain the integrated circuit 1. The bumps 20, 21 are made of gold and are offset with respect to the vias 12, 13. For the exemplary embodiment the bumpmask process used in terms of resist used is adapted in a way, that during the development of the resist, the photoresist layer 11 is not dissolved or damaged.

The integrated circuit 1, in combination with an antenna 22, is meant to be used as the transponder 2 that is shown in FIG. 7. The antenna 22 is a conductive structure applied on a substrate 23. Before continuing producing the transponder 2, the wafer is sawed in order to obtain individual integrated circuits 1 for the exemplary embodiment. In order to attach the substrate 23 with the antenna 22 to the integrated circuit 1, so that the bumps 20, 21 are electrically connected to the antenna 22, the integrated circuit 1 is pressed against the substrate 23, the surface 17 facing the side of the substrate 23, to which the antenna 22 is attached. The connection step may be performed by means of, for instance, pressure welding and ultrasonic welding. However, also other techniques may be used for the connecting step. Additionally, a glue layer 24 may be provided between the surface 17 of the integrated circuit 1 and the substrate 23.

It should be noted that the photoresist layer 11 may be a multi-component layer having an adhesive characteristic for attaching the integrated circuit 1 to the substrate 23. An example of such a multi-component layer is an acrylic-based photoresist, which comprises UV-initiators and thermal initiators. Such a multi-component layer, therefore, can be treated utilizing the lithographic process for producing the aperture 12, 13 in the photoresist layer by UV-radiation and is partly cross-linked. During the final assembly process, the photoresist layer 11 is thermally activated and cured completely as well as cross-linked to the substrate 23. In this case, no additional adhesive layer between the patterned mask 14 and the substrate 23 is necessary.

FIG. 8 shows the steps of obtaining a transponder 2. First, a photoresist layer 11 is applied to a surface 8 of the semiconductor device 3. Second, a patterned mask 14 is generated by means of a lithographic process so as to obtain vias 12, 13 matching associated connection pads 5, 6. Third, the vias 12, 13 are filled with bumps 15, 16. Four, flashes 18, 19 are deposited on the patterned mask 14 electrically connected to the bumps 15, 16. Five, bumps 20, 21 are deposited on the patterned mask 14 offset to the vias 12, 13 and touching the flashes 18, 19. Finally, a transponder 2 is obtained by attaching the integrated circuit 1 to a substrate 23, which comprises an antenna 22.

Figure 9:
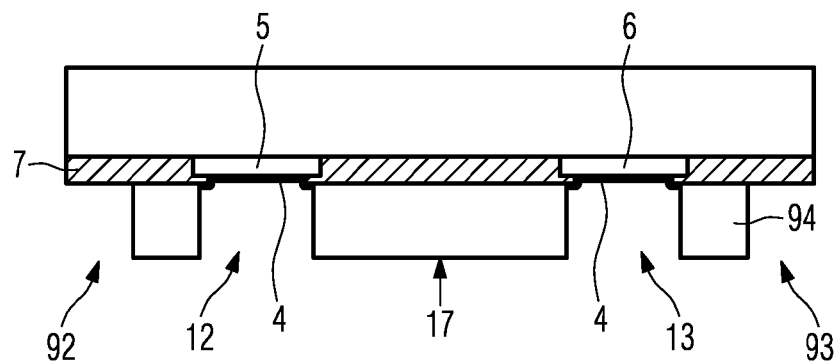
FIGS. 9 to 11 are steps illustrating the production of an alternative embodiment of an inventive integrated circuit.
Figure 10:
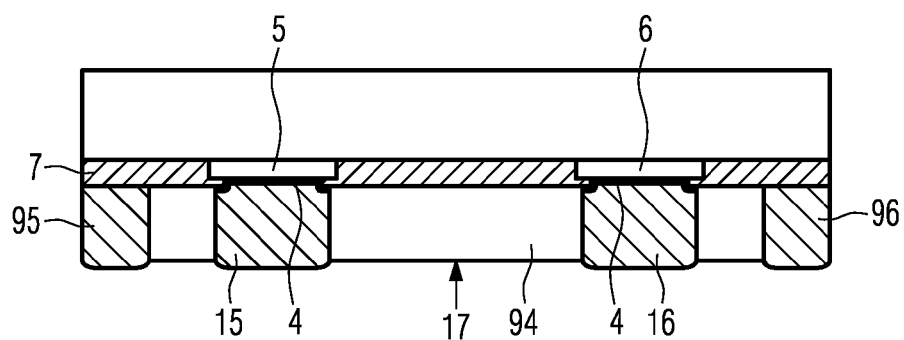
Figure 11:
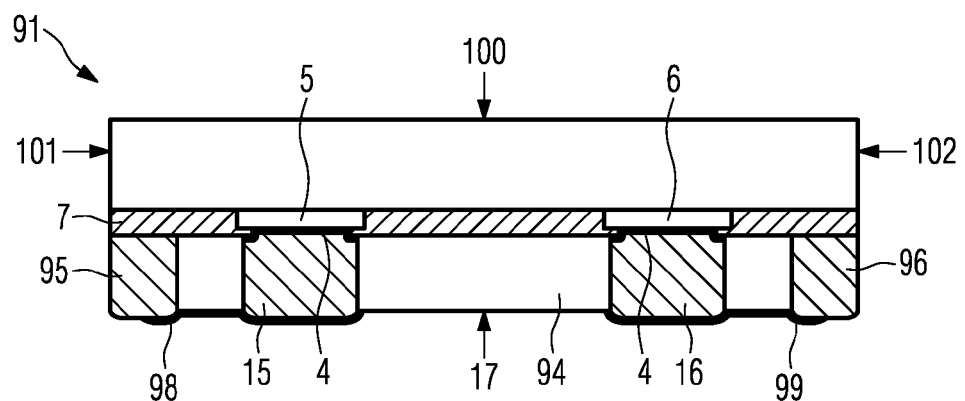

FIGS. 9-11 illustrate the production of an alternative embodiment of an integrated circuit 91. If not explicitly mentioned, then components of the integrated circuit 91, which correspond to components of the integrated circuit 1, are denoted with the same reference signs.

After the drying of the photoresist layer 11, the photoresist layer 11 is patterned to produce a patterned mask 94, which is shown in FIG. 9. The patterned mask 94 comprises, just like the patterned mask 14 of the integrated circuit 1, vias 12, 13 exposing the flashes 4. In addition, the mask 94 comprises vias 92, 93 exposing parts of the passivation layer 7 and thus parts of the surface 8. The vias 92, 93 are also located at edges of the integrated circuit 91 to be produced. The photoresist layer 11 including the vias 12, 13, 92, 93 forms the patterned mask 94, which also has the surface 17 facing away from the semiconductor device 3 and used for the next production step.

The next production step is depositing the bumps 15, 16 in the vias 12, 13 as well as depositing bumps 95, 96 in the vias 92, 93, as shown in FIG. 10. For the exemplary embodiment, the bumps 15, 16, 95, 96 are gold bumps and are deposited on the flashes 4 and the surface 8 of the passivation layer 7, respectively, utilizing an electroless deposition process.

After that, further flashes 98, 99 are deposited on the surface 17 of the patterned mask 94 and on the bumps 15, 16, 95, 96 as shown in FIG. 11. The flashes 98, 99 are made of gold and are deposited utilizing an evaporation or sputtering process and are patterned by an ablation process for the exemplary embodiment. The flashes 98, 99 are a conductive structure electrically connecting the bump 15 to the bump 95 and electrically connecting the bump 16 to the bump 96. As a result, the connection pad 5 is electrically connected to the bump 95 and the connection pad 6 is electrically connected to the bump 96.

Figure 12:
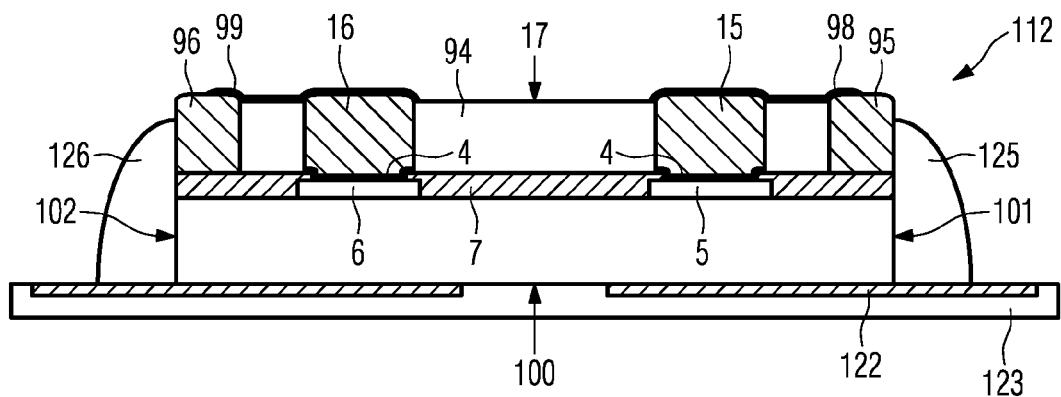
FIG. 12 is an alternative transponder comprising the integrated circuit of FIGS. 9 to 11.

The integrated circuit 91, in combination with an antenna 122 forms a transponder 112 shown in FIG. 12. The antenna 122 is a conductive structure attached to a substrate 123. Before continuing producing the transponder 112, the wafer is sawed in order to obtain individual integrated circuits 91 for the exemplary embodiment.

The integrated circuit 91 has a surface 100 opposite to the surface 17. For the exemplary embodiment, the integrated circuit 91 is attached with its surface 100 to the substrate 123. Then, the conductive structure of the antenna 122 is connected to the bumps 95, 96 utilizing solder bumps 125, 126. As a result, the antenna 122 is connected to the antenna 122 not in flip-chip technology, but is connected to side walls 101, 102 of the integrated circuit 91 for the exemplary embodiment.

Figure 13:
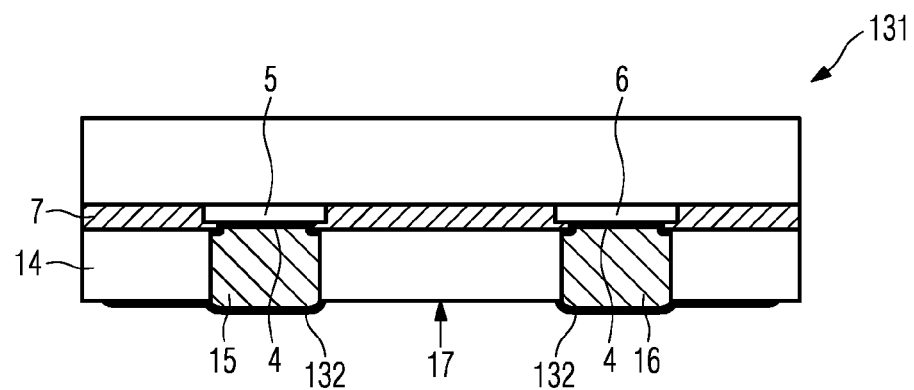
FIGS. 13 and 14 show a further exemplary embodiment of an inventive integrated circuit.

FIG. 13 shows a further embodiment of an integrated circuit 131. If not explicitly mentioned, then components of the integrated circuit 131, which correspond to components of the integrated circuit 1, are denoted by the same reference signs.

Figure 14:
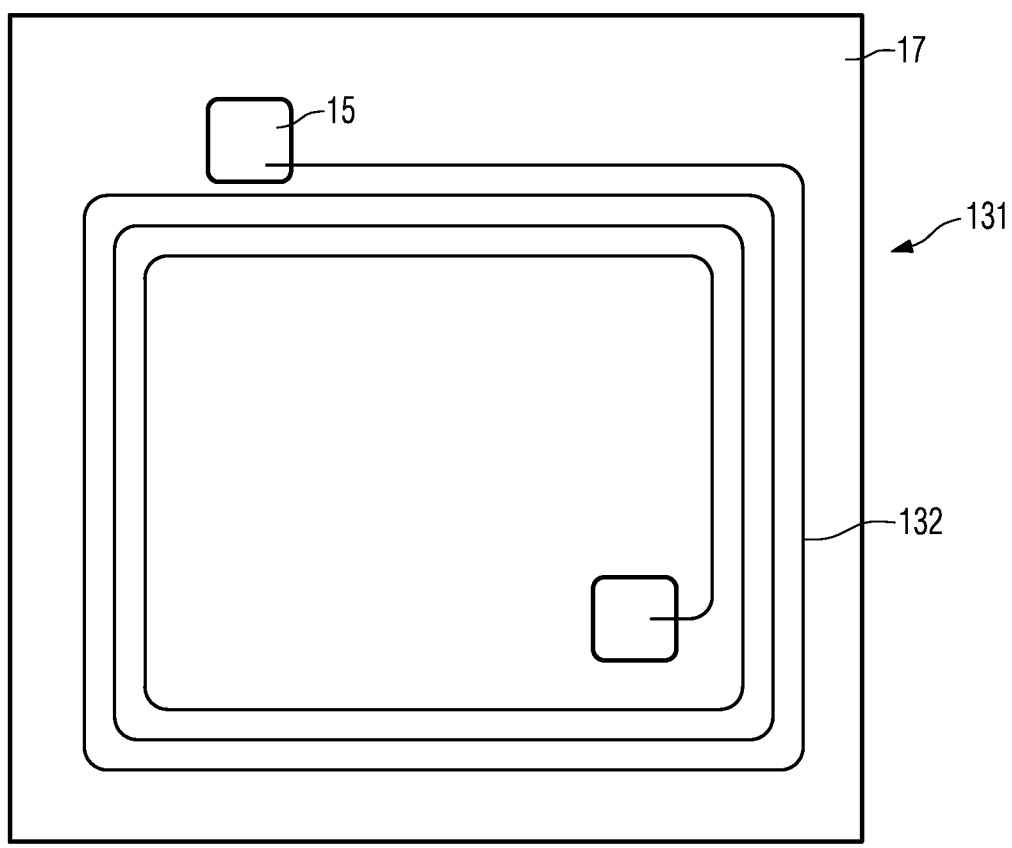

The main difference between the integrated circuits 1 and 131 are the flashes 18, 19 and the bumps 20, 21, which the integrated circuit 131 lacks. Instead of flashes 18, 19 connected to the bumps 20, 21, the integrated circuit 131 comprises a conductive structure deposited on the surface 17 of the patterned mask 14. For the exemplary embodiment, the conductive structure is a loop antenna 132 connected to the bumps 15, 16. A plan view of the surface 17 of the integrated circuit 131 including the antenna 132 is shown in FIG. 14.

The antenna 132 may be the main antenna of the integrated circuit 131. Then the integrated circuit 131 may form a complete transponder. The antenna 132 may also be a coupling antenna to be coupled to a further antenna not shown in the Figures. Then, the integrated circuit 131 forms a transponder when coupled to this main antenna.

Finally, it should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The words "comprising" and "comprises", and the like, do not exclude the presence of elements or steps other than those listed in any claim or the specification as a whole. The singular reference of an element does not exclude the plural reference of such elements and vice versa. In a device claim enumerating several means, several of these means may be embodied by one and the same item of hardware. The mere fact that certain measures are recited in mutually different dependent claims does not indicate that a combination of these measures cannot be used to advantage.

The invention claimed is:

1. A method of producing an integrated circuit for a transponder, the method comprising the steps of:
    applying a photoresist layer on a first surface of a semiconductor device;
    generating a patterned mask by lithographically patterning said photoresist layer, so that said photoresist layer comprises at least one first via, said patterned mask comprising a second surface facing away from said first surface;
    filling said first via with a first bump by depositing said first bump on said first surface; and
    after said first bump is deposited on said first surface, forming, on said second surface of said patterned mask on a non-via portion of said patterned mask, a conductive structure electrically connected to said first bump, wherein said first bump and said conductive structure are separate structures.

2. The method of claim 1, comprising the step of depositing at least one second bump on said second surface of said patterned mask, said second bump being offset with respect to said first via and touching said conductive structure.

3. A method of producing a transponder, comprising the steps of:
    producing an integrated circuit according to claim 2; and
    attaching said integrated circuit with the second surface to a substrate which comprises an antenna structure, so that said antenna structure is electrically connected to said second bump.

4. The method of claim 1, comprising the step of generating at least one second via in said photoresist layer, filling said second via with a second bump, and forming said conductive structure on said second surface of said patterned mask to electrically connect said first bump to said second bump.

5. A method of producing a transponder, the method comprising the steps of:
    producing an integrated circuit according to claim 4;
    attaching to a substrate comprising an antenna structure, said integrated circuit, so that said second surface faces away from said substrate; and
    electrically connecting said antenna structure with said second bump.

6. The method of claim 1, wherein said first bump is a gold bump and/or wherein said conductive structure is an antenna.

7. The method of claim 1, wherein the first via is completely filled by the first bump.

8. The method of claim 1, wherein said first bump is a gold bump.

9. The method of claim 1, wherein forming, on said second surface of said patterned mask on the non-via portion of said patterned mask, the conductive structure comprises forming, on said second surface of said patterned mask on the non-via portion of said patterned mask, the conductive structure electrically connected to the non-via portion of said patterned mask and electrically connected to said first bump.

10. An integrated circuit for a transponder, comprising:
    a semiconductor device, which comprises a first surface;
    a patterned mask made of a photoresist layer and applied on said first surface, wherein said photoresist layer comprises at least one first via filled with a first bump deposited on said first surface, said patterned mask comprising a second surface facing away from said first surface; and a conductive structure deposited on said second surface on a non-via portion of said patterned mask after said first bump is deposited on said first surface and electrically connected to said first bump, wherein said first bump and said conductive structure are separate structures.

11. The integrated circuit of claim 10, comprising at least one second bump deposited on said second surface of said patterned mask, said second bump being offset with respect to said first via and touching said conductive structure.

12. A transponder, comprising:
said integrated circuit of claim 11; and
a substrate with an antenna structure, said substrate being attached to said second surface of said integrated circuit, so that said antenna structure is electrically connected to said second bump.

13. The integrated circuit of claim 10, wherein said patterned mask comprises at least one second via filled with a second bump which is electrically connected to said first bump via said conductive structure.

14. A transponder, comprising:
said integrated circuit of claim 13;
a substrate comprising an antenna structure, said substrate being attached to said integrated circuit, so that said second surface faces away from said substrate; and
connections electrically connecting said antenna structure with said second bump.

15. The integrated circuit of claim 10, wherein said first bump is a gold bump and/or wherein said conductive structure is an antenna.

16. The integrated circuit of claim 10, wherein the first via is completely filled by the first bump.

17. The integrated circuit of claim 10, wherein said first bump is a gold bump.

18. The integrated circuit of claim 10, wherein the conductive structure is electrically connected to the non-via portion of said patterned mask and electrically connected to said first bump.

* * * * *